United States Patent
Lin et al.

(10) Patent No.: US 12,453,129 B1
(45) Date of Patent: Oct. 21, 2025

(54) STACKED NANOSHEET DEVICE FOR PROCESS AND PERFORMANCE OPTIMIZATION

(71) Applicant: Synopsys, Inc., Sunnyvale, CA (US)

(72) Inventors: Xi-Wei Lin, Fremont, CA (US); Victor Moroz, Saratoga, CA (US); Zudian Qin, Cupertino, CA (US); Plamen Asenov Asenov, Glasgow (GB)

(73) Assignee: Synopsys, Inc., Sunnyvale, CA (US)

( * ) Notice: Subject to any disclaimer, the term of this patent is extended or adjusted under 35 U.S.C. 154(b) by 371 days.

(21) Appl. No.: 17/981,185

(22) Filed: Nov. 4, 2022

(51) Int. Cl.
| | | |
|---|---|---|
| H10D 30/67 | (2025.01) | |
| H10D 30/01 | (2025.01) | |
| H10D 30/43 | (2025.01) | |
| H10D 62/10 | (2025.01) | |
| H10D 84/01 | (2025.01) | |
| H10D 84/03 | (2025.01) | |
| H10D 84/83 | (2025.01) | |

(52) U.S. Cl.
CPC ....... H10D 30/6735 (2025.01); H10D 30/014 (2025.01); H10D 30/43 (2025.01); H10D 30/6757 (2025.01); H10D 62/121 (2025.01); H10D 84/0128 (2025.01); H10D 84/038 (2025.01); H10D 84/834 (2025.01)

(58) Field of Classification Search
CPC ..... H01L 21/823412; H01L 21/823431; H01L 29/42392; H10D 30/01; H10D 30/014; H10D 30/019–0198; H10D 30/43; H10D 30/435; H10D 30/501–509; H10D 30/6735; H10D 30/674; H10D 30/6757; H10D 62/121; H10D 62/122; H10D 84/01; H10D 84/0128; H10D 84/0158; H10D 84/038; H10D 84/8311; H10D 84/8312; H10D 84/83125; H10D 84/83135; H10D 84/83138; H10D 84/8314; H10D 84/8316; H10D 84/832–833; H10D 84/834; H10D 84/835; H10D 84/836; H10D 84/837–839
See application file for complete search history.

(56) References Cited

U.S. PATENT DOCUMENTS

2023/0065195 A1* 3/2023 Hung ................. H10D 30/6219

* cited by examiner

Primary Examiner — Cheung Lee
(74) Attorney, Agent, or Firm — Weaver Austin Villeneuve & Sampson LLP

(57) ABSTRACT

A method of forming a multitude of GAAFETs on a silicon substrate includes forming alternating layers of Si nanosheets and SiGe alloys above the silicon substrate, depositing a layer of oxide buffer above the top layer of SiGe alloy, depositing a mask layer above the oxide buffer layer, patterning the mask and the oxide, and performing a RIE of the silicon nanosheet and SiGe alloy layers so as to form tapered pillars of silicon nanosheet and SiGe alloy layers. In each tapered pillar, a width of the first layer of silicon nanosheet that is closer to the substrate is greater than a width of the etched second layer of silicon nanosheet that is formed above the first layer of silicon nanosheet. The first, and second tapered silicon nanosheet layers in each pillar form channels of first and second GAAFETs.

18 Claims, 11 Drawing Sheets

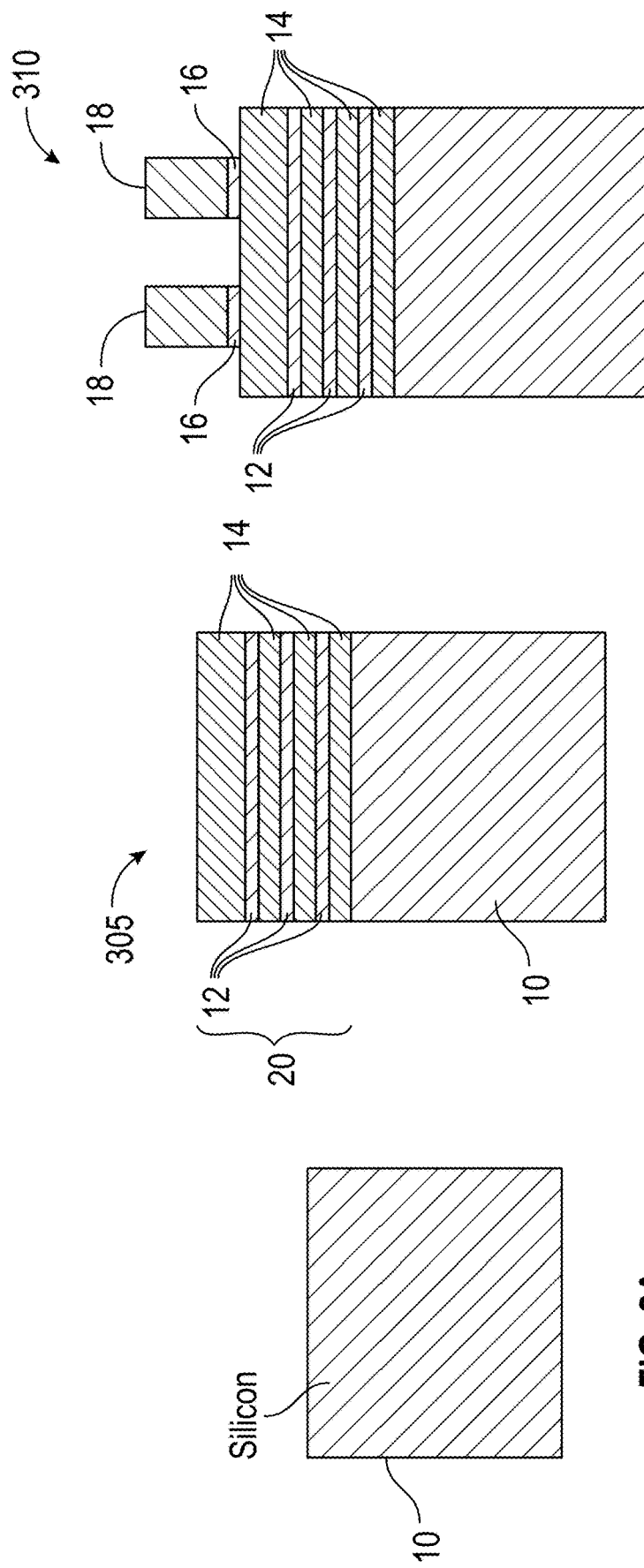

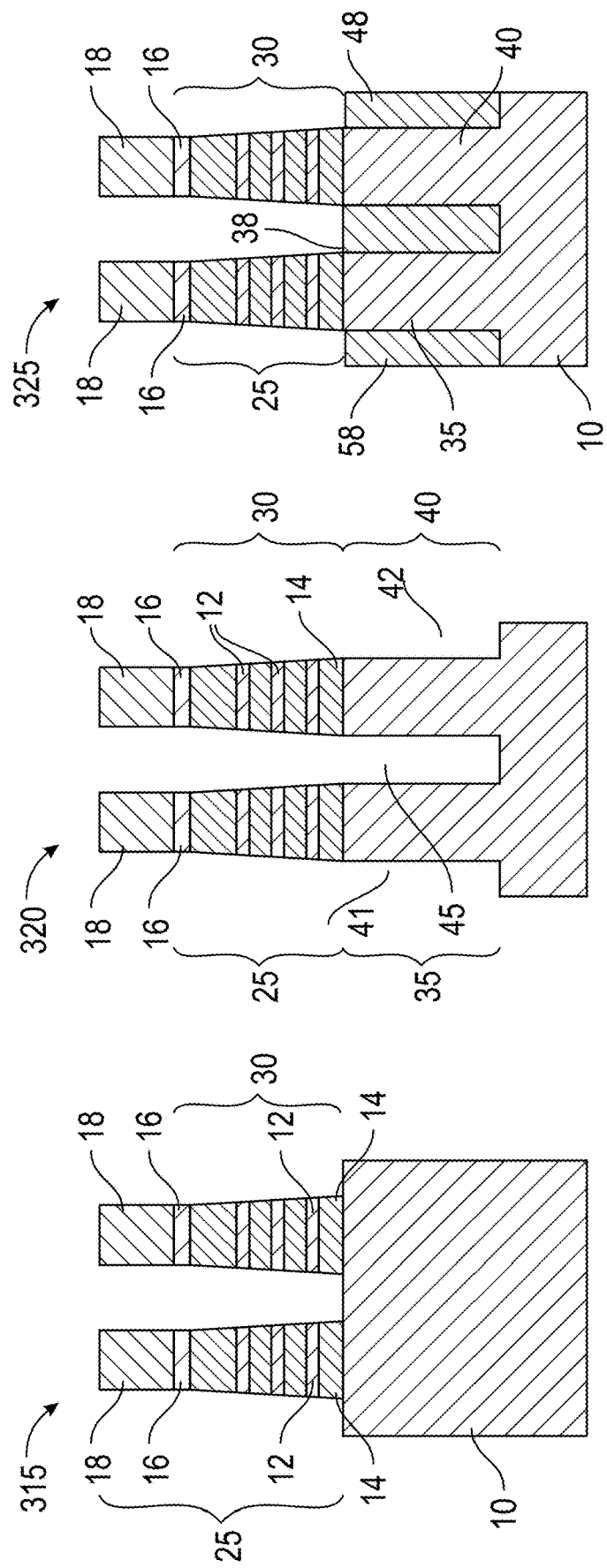

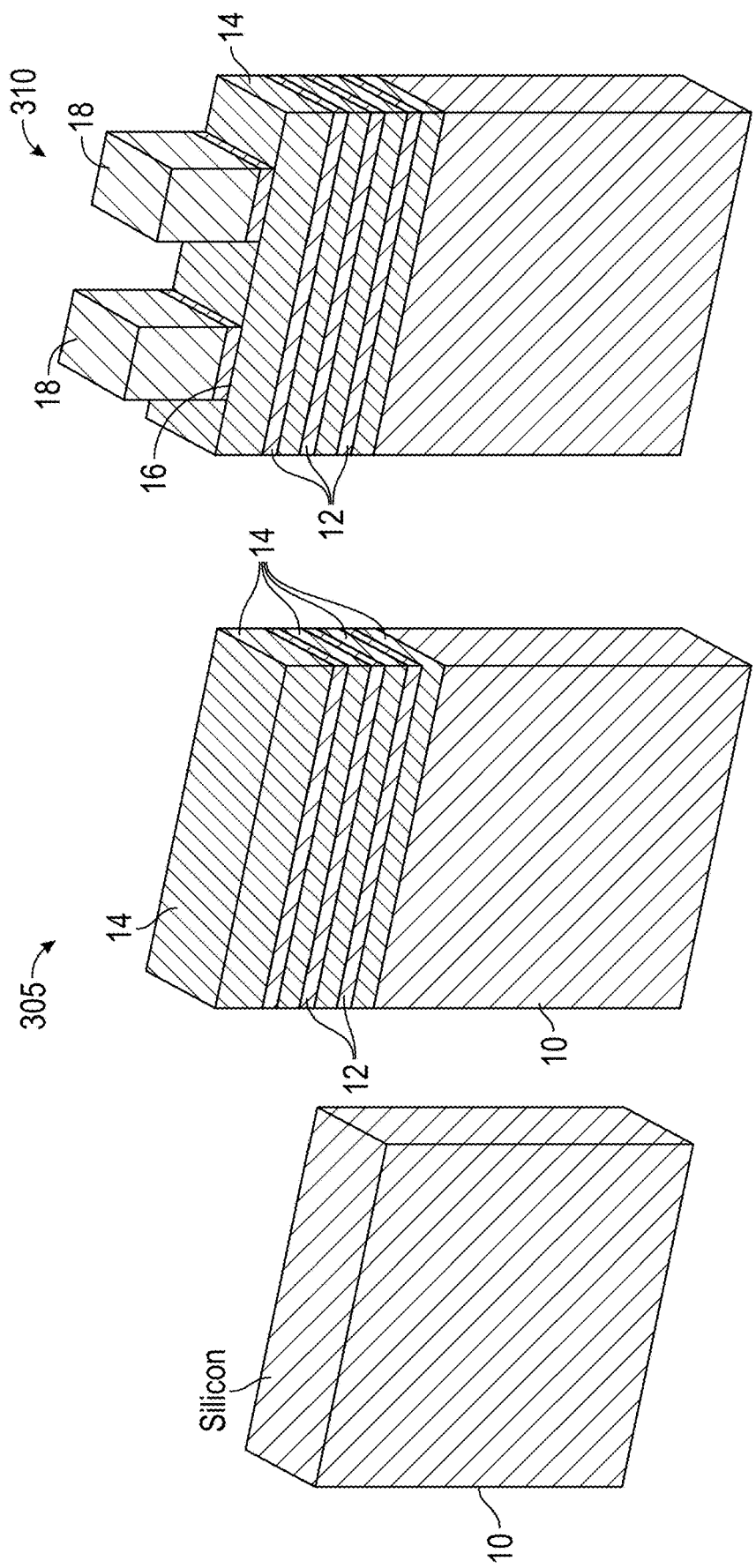

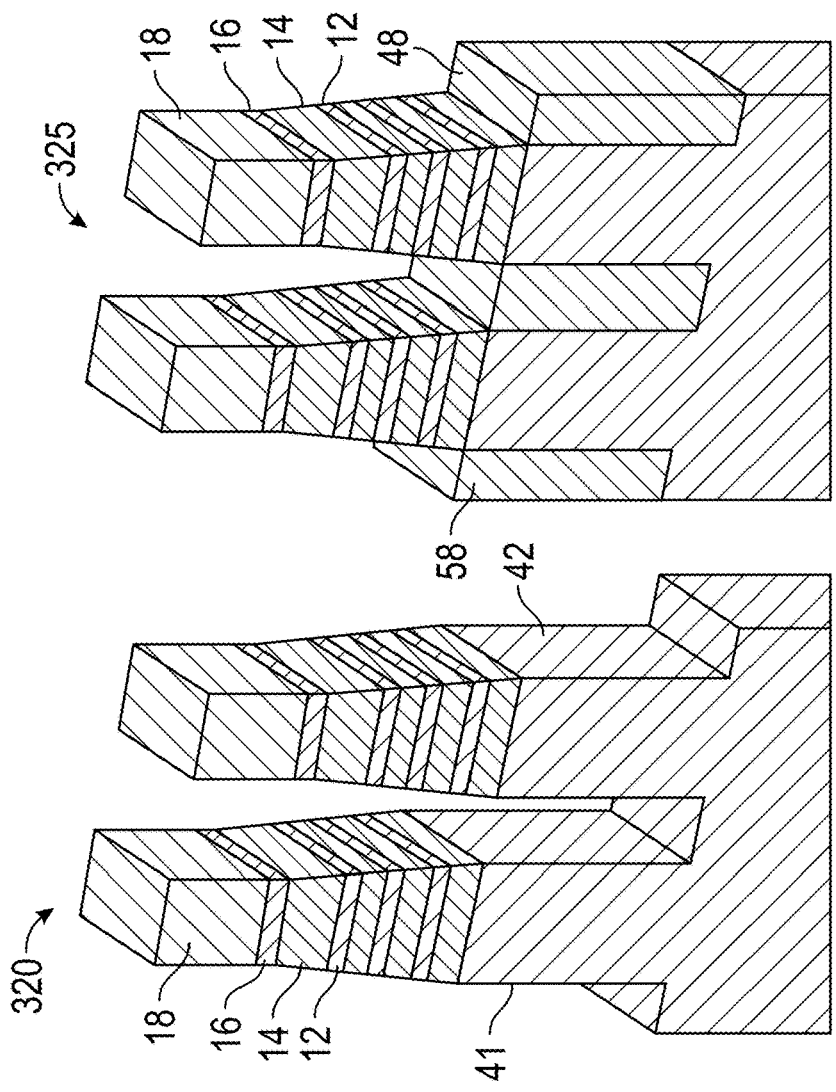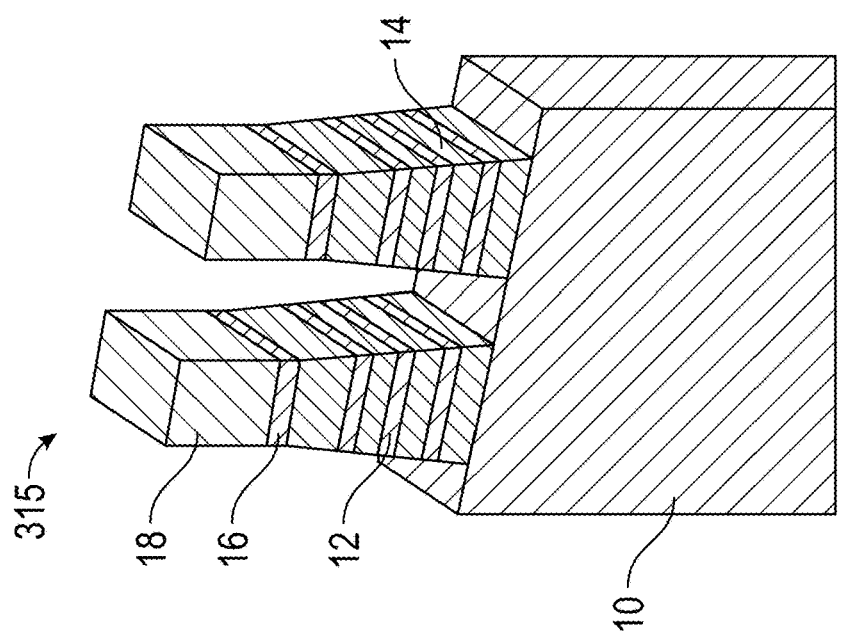

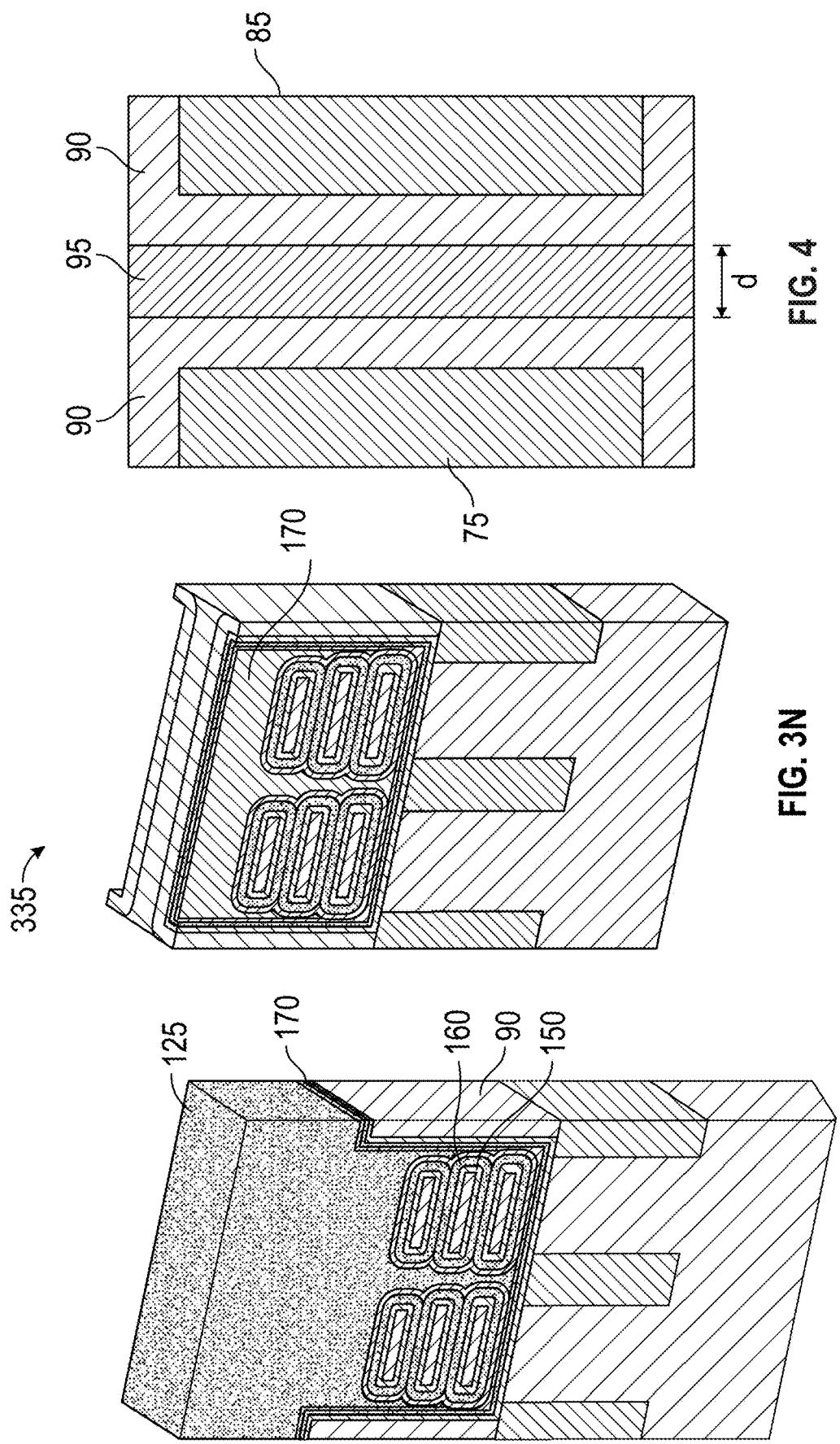

STACKED NANOSHEET DEVICE FOR PROCESS AND PERFORMANCE OPTIMIZATION

TECHNICAL FIELD

The present application relates to semiconductor devices, and more particularly to a gate-all-around field effect transistor.

BACKGROUND

Advances in semiconductor device and manufacturing technologies continue to lead to scaling down of transistor dimensions and an attendant increase in their density in integrated circuits. Most state-of-the-art semiconductor fabrication processes use Fin Field Effect Transistors (FinFET). However, as the semiconductor processing dimensions continue to scale down, Gate-All-Around (GAA) Field Effect Transistors (GAAFETs) have gained considerable attention as a possible substitute for FinFETs. A GAAFET is similar in function to a FinFET but the gate material surrounds the channel region of the GAAFET from all sides.

SUMMARY

A method of forming a multitude of gate-all-around (GAA) Field Effect Transistors (FET) on a silicon substrate, in accordance with one embodiment of the present disclosure, includes in part, forming a first layer of Silicon Germanium (SiGe) alloy above the silicon substrate; forming a first layer of silicon nanosheet above the first layer of SiGe alloy; forming a second layer of SiGe alloy above the first layer of silicon nanosheet; forming a second layer of silicon nanosheet above the second layer of SiGe alloy; and performing a reactive ion etch of the silicon nanosheet and SiGe alloy layers so as to form at least first and second tapered pillars of silicon nanosheet and SiGe alloy layers. In each of the first and second tapered pillars a width of the etched first layer of silicon nanosheet is greater than a width of the etched second layer of silicon nanosheet. The first silicon nanosheet layer disposed in the first tapered pillar forms a channel of a first GAAFET. The second silicon nanosheet layer disposed in the first tapered pillar forms a channel of a second GAAFET. The first silicon nanosheet layer disposed in the second tapered pillar forms a channel of a third GAAFET. The second silicon nanosheet layer disposed in the second tapered pillar forms a channel of a fourth GAAFET.

In one embodiment, the method further includes, in part, forming a third layer of SiGe alloy above the second layer of silicon nanosheet; depositing an oxide buffer layer above the third layer of SiGe alloy; depositing a mask layer above the oxide buffer layer; and patterning the mask and the oxide buffer layers to expose a surface of the third layer of SiGe.

In one embodiment, the method further includes, in part, forming trenches in the silicon substrate; and filling the trenches with oxide. In one embodiment, the method further includes, in part, removing the oxide buffer layer; and removing the mask layer. In one embodiment, the method further includes, in part, depositing a layer of protective oxide layer over the first and second tapered pillars and the oxide-filled trenches; depositing a layer of polysilicon over the protective oxide layer; and performing chemical mechanical polishing to planarize the polysilicon layer.

In one embodiment, the method further includes, in part, forming a trench in the planarized polysilicon; forming a first layer of silicon oxide along a first sidewall of the planarized polysilicon in the trench; forming a second layer of silicon oxide along a second sidewall of the planarized polysilicon in the trench; and forming a layer of silicon oxynitride between the first and second silicon oxide layers in the trench. In one embodiment, the method further includes, in part, removing the planarized polysilicon; removing the protective oxide layer; and removing the first and second layers of the SiGe alloy from the first and second tapered pillars. In one embodiment, the method further includes, in part, forming a layer of gate oxide around each of the first and nanosheet sheet layers of each of the first and second tapered pillars.

In one embodiment, the method further includes, in part, forming a layer of work function metal around the gate oxide layer of each of the first and second nanosheet sheet layers of each of the first and second tapered pillars; and forming a layer of barrier metal around the work function metal layer of each of the first and second nanosheet sheet layers of each of the first and second tapered pillars. In one embodiment, the method further includes, in part, depositing a layer of tungsten over the layer of barrier metal; and planarizing the tungsten layer. In one embodiment, each of the tapered pillars of Si—SiGe alloy forms an angle ranging from 70° to 85° with respect to a surface of the silicon substrate.

A semiconductor device structure, in accordance with one embodiment of the present disclosure, includes, in part, a first silicon pillar formed above a silicon substrate; a second silicon pillar formed above the silicon substrate and insulated from the first silicon pillar by an oxide filled trench; a first silicon nanosheet layer formed above the first silicon pillar and positioned at a first height relative to a surface of the substrate wherein the first silicon nanosheet layer has a first width; a second silicon nanosheet layer formed above the first silicon pillar and positioned at a second height relative to the surface of the substrate, wherein the second height is greater than the first height, and wherein the second silicon nanosheet layer has a second width smaller than the first width; a first silicon nanosheet layer formed above the second silicon pillar and positioned at the first height, wherein the first silicon nanosheet layer formed above the second silicon pillar has the first width; and a second silicon nanosheet layer formed above the second silicon pillar and positioned at the second height, wherein the second silicon nanosheet layer formed above the second silicon pillar has the second width.

The semiconductor device structure, in accordance with one embodiment, further includes, in part, a layer of oxide formed above the first and second silicon pillars and the trench, wherein the first and silicon nanosheet layers associated with each of the first and second silicon pillars protrude from the layer of oxide. In one embodiment, the first and second silicon pillars are formed by etching the silicon substrate. The semiconductor device structure, in accordance with one embodiment, further includes, in part, a layer of gate oxide disposed around the first and second silicon nanosheet layers associated with each of the first and second silicon pillars. In one embodiment, the gate oxide layer disposed around the first and second silicon nanosheet layers associated with each of the first and second silicon pillars includes silicon oxide and hafnium oxide.

The semiconductor device structure, in accordance with one embodiment, further includes, in part, a layer of work function metal disposed around the gate oxide layers of each of the first and second silicon nanosheet layers associated with each of the first and second silicon pillars. The semiconductor device structure, in accordance with one embodiment, further includes, in part, a layer of barrier metal disposed around the work function metal of each the first and second silicon nanosheet layers associated with each of the first and second silicon pillars.

In one embodiment, the first and second silicon nanosheet layers associated with the first silicon pillar form first and second channels of first and second gate-all-around (GAA) Field Effect Transistors (FET) respectively. In such embodiment, the first and second silicon nanosheet layers associated with the second silicon pillar form third and fourth channels of third and fourth GAAFETs respectively.

The semiconductor device structure, in accordance with one embodiment, further includes, in part, a layer of tungsten connected to the barrier metal formed around each of the first, second, third and fourth GAAFETs. The tungsten layer controls a gate voltage of each of the first, second, third and fourth GAAFETs. In one embodiment, a line drawn from a corner of the channel of the first GAAFET to a corresponding channel of the second GAAFET forms an angel ranging from 70° to 85° with respect to a surface of the silicon substrate.

A non-transitory computer readable medium, in accordance with one embodiment of the present disclosure, includes stored instructions which when executed by a processor, cause the processor to form a first layer of SiGe alloy above the silicon substrate; form a first layer of silicon nanosheet above the first layer of SiGe alloy; form a second layer of SiGe alloy above the first layer of silicon nanosheet; form a second layer of silicon nanosheet above the second layer of SiGe alloy; and perform a reactive ion etch of the silicon nanosheet and SiGe alloy layers so as to form at least first and second tapered pillars of silicon nanosheet and SiGe alloy layers, wherein in each of the first and second tapered pillars a width of the etched first layer of silicon nanosheet is greater than a width of the etched second layer of silicon nanosheet, wherein the first silicon nanosheet layer disposed in the first tapered pillar forms a channel of a first GAAFET, the second silicon nanosheet layer disposed in the first tapered pillar forms a channel of a second GAAFET, the first silicon nanosheet layer disposed in the second tapered pillar forms a channel of a third GAAFET, and the second silicon nanosheet layer disposed in the second tapered pillar forms a channel of a fourth GAAFET.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

FIG. 2A is a cross sectional view of a silicon substrate in which a multitude of GAAFETs are formed, in accordance with one embodiment of the present disclosure.

FIG. 2B shows alternating layers of silicon nanosheets and Silicon Germanium (SiGe) alloy formed in the silicon substrate of FIG. 1, in accordance with one embodiment of the present disclosure.

FIG. 2C shows the device structure of FIG. 2B after performing a number of deposition and patterning steps, in accordance with one embodiment of the present disclosure.

FIG. 2D shows the device structure of FIG. 2C after a reactive ion etching process, in accordance with one embodiment of the present disclosure.

FIG. 2E shows the device structure of FIG. 2D after forming trenches in the silicon substrate, in accordance with one embodiment of the present disclosure.

FIG. 2F shows the device structure of FIG. 2E after filling the trenches, in accordance with one embodiment of the present disclosure.

FIG. 3A is a perspective view of the device structure shown in FIG. 2A.

FIG. 3B is a perspective view of the device structure shown in FIG. 2B.

FIG. 3C is a perspective view of the device structure shown in FIG. 2C.

FIG. 3D is a perspective view of the device structure shown in FIG. 2D.

FIG. 3E is a perspective view of the device structure shown in FIG. 2E.

FIG. 3F is a perspective view of the device structure shown in FIG. 2F.

FIG. 3M is a perspective view of the device structure shown in FIG. 2M.

FIG. 3N is a perspective view of the device structure shown in FIG. 2N.

FIG. 4 is a top view of the device structure shown in FIG. 2I.

DETAILED DESCRIPTION

One of the shortcomings of a GAAFET is the degradation of its source/drain resistance which reduces its effective drain voltage and increases its threshold voltage. Another shortcoming of a typical GAAFET is the challenge posed in forming a vertical sidewall during the patterning process. A need continues to exist for an improved GAAFET A GAAFET, in accordance with one embodiment of the present disclosure, has tapered sidewalls and is therefore less prone to statistical variations that occur during fabrication of an integrated circuit or System-on-Chip (SoC) that contain the GAAFET.

Figure 1:
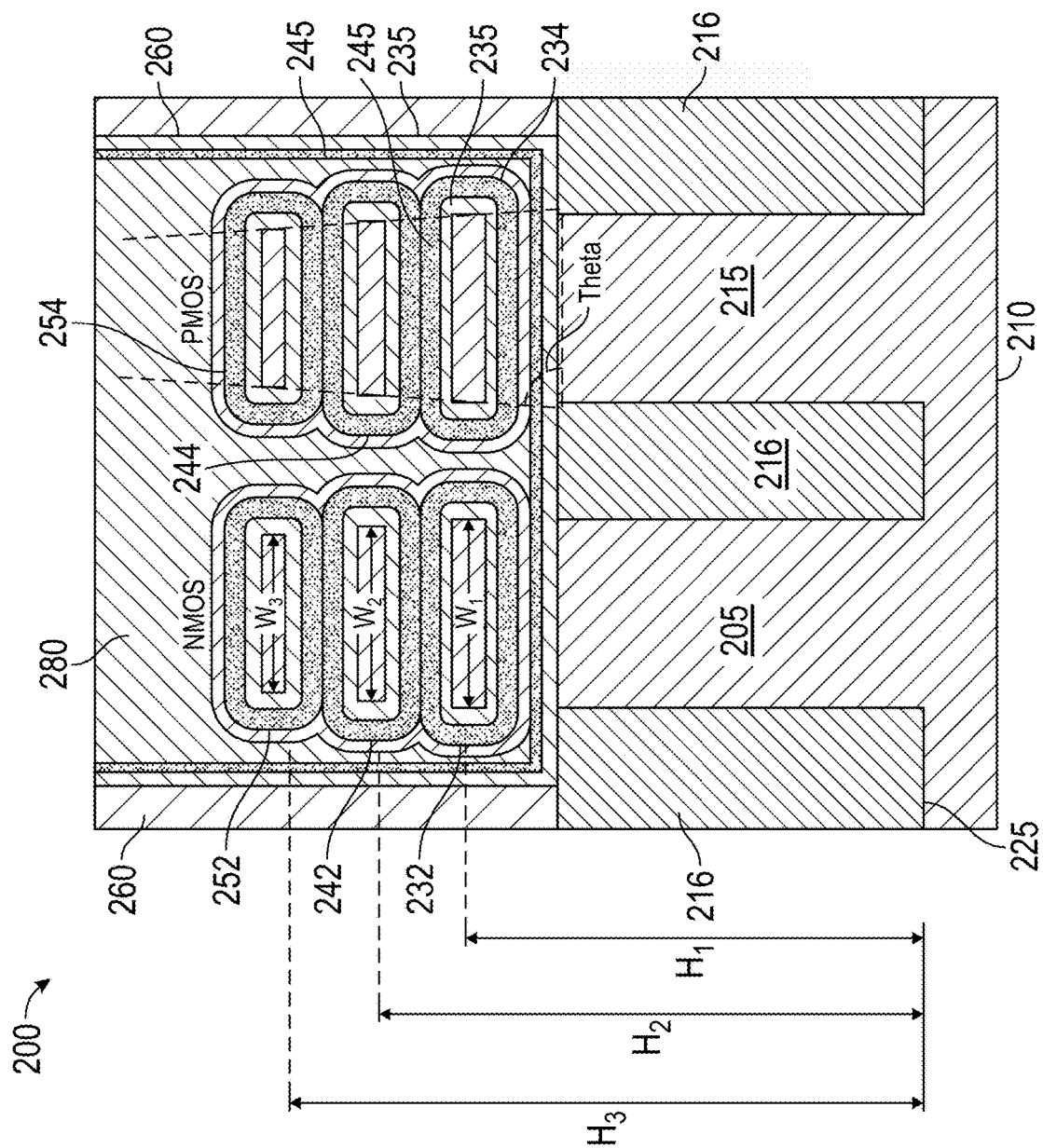
FIG. 1 is a cross-sectional view of a semiconductor device structure, in accordance with one embodiment of the present disclosure.

FIG. 1 is a cross-sectional view of a semiconductor device structure 200, in accordance with one embodiment of the present disclosure. Device structure 200 is shown as including, in part, three N-channel metal oxide semiconductor (NMOS) transistor 232, 242, 252, and three P-channel metal oxide semiconductor (PMOS) transistors 234, 244, 254. The NMOS and PMOS transistors are formed above silicon pillars 205, and 215 respectively. Silicon pillars 205 and 215 are formed from silicon substrate 210. NMOS transistor 232 and PMOS transistor 234 have the same channel width $W_1$ and are formed at substantially the same height $H_1$ (measured from the center of the transistor's channels) above interface 225 of substrate 210 and silicon pillars 205 and 215. NMOS transistor 242 and PMOS transistor 244 have the same channel width $W_2$ and are formed at substantially the same height $H_2$ above interface 225. NMOS transistor 252 and PMOS transistor 254 have the same channel width $W_3$ and are formed at substantially the same height $H_3$ above interface 225. Device structure 200 is tapered at an angle Theta, as shown, such that $W_3<W_2<W_1$. In one example, angle Theta may vary from 70° to 85°.

Each of the transistors has a gate dielectric 235 that includes a layer of silicon oxide. In some embodiments, gate dielectric 235 may include a relatively thin layer of hafnium oxide, described further below. Gate dielectric 235 is formed around the entirety of the channels of the transistors, as well as along the sidewalls of insulating layer 260. Disposed around the gate dielectric layer 235 is one or more layers of metal 245. In one embodiment, metal layer 245 includes a layer of work function metal and a layer of barrier metal. Metal layer 245 is also disposed along the sidewalls of insulator 260 between the gate dielectric 235 and tungsten 280 that provides electrical connection to the gates of the transistors. Although device structure 200 is shown as including three vertically stacked N-channel GAAFETs and three vertically stacked P-channel GAAFETs, it is understood that in other embodiments, device structure 200 may have more or fewer than three vertically stacked N-channel GAAFETs and three vertically stacked P-channel GAAFETs. A method of manufacturing device structure 200 is described in detail below.

Figure 2G:
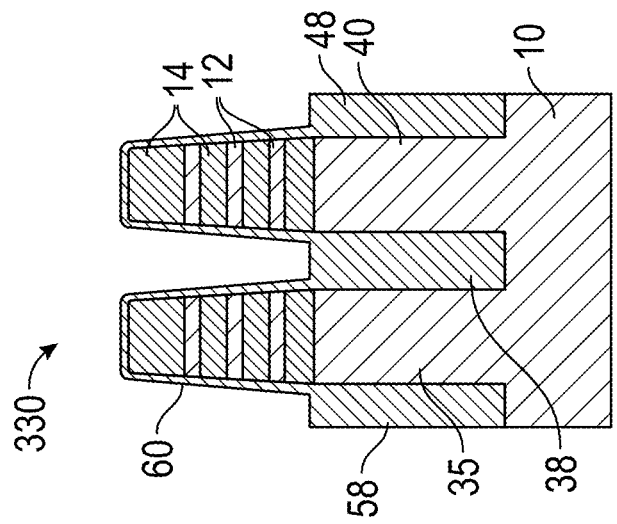
FIG. 2G shows the device structure of FIG. 2F after deposition of a layer of protective oxide, in accordance with one embodiment of the present disclosure.

A GAAFET, in accordance with one embodiment of the present disclosure, is formed in a silicon substrate. FIG. 2A is a cross sectional view of a silicon substrate 10 in which a multitude of GAAFET are formed. FIG. 3A is a perspective view of substrate 10.

To form the GAAFET, in accordance with one embodiment of the present disclosure, alternating layers of silicon nanosheets 12 and Silicon-Germanium (SiGe) alloy 14 are formed above substrate 10 to form device structure 305 shown in FIG. 2B. Although the following description of the embodiments of the present disclosure are provided with reference to a GAFET that includes alternating layers of silicon nanosheets and SiGe alloy, it is understood that embodiments of the present disclosure equally apply to a GAFET that includes alternating layers of silicon nanosheet and silicon-Germanium-Tin alloy (SiGeSn). The silicon nanosheet layers 12 and SiGe alloy layers 14 may be formed using epitaxial growth and then patterned using standard lithography techniques. The topmost layer of SiGe alloy 14 has a different thickness than the remaining 3 layers of SiGe layers.

FIG. 2B shows three silicon nanosheet layers 12 each disposed between a different pair of SiGe alloy layers 14. Accordingly, in the example shown in FIG. 2B, each vertical stack 20 of silicon nanosheets layers 12 and SiGe alloy layers 14 results in the formation of three P-channel and three N-channel transistors. It is understood that to include more N-channel and P-channel transistors in substrate 10, additional layers of silicon nanosheets 12 and SiGe alloy layers 14 are formed in substrate 10. In one example, each silicon nanosheet layer 12 has a thickness ranging from 4 nm to 8 nm, and each SiGe alloy layer 14, except for the topmost SiGe alloy layer, has a thickness ranging from 10 nm to 20 nm. The topmost layer of SiGe alloy may have a thickness ranging from 15 nm to 50 nm. FIG. 3B is a perspective view of device structure 305 shown in FIG. 2B.

Referring to FIG. 2C, next a layer 16 of oxide buffer and a layer of mask 18 are formed above the topmost layer of SiGe using chemical vapor deposition techniques. The oxide buffer layer and the mask layer are thereafter patterned to form device structure 310, as shown in FIG. 2C. FIG. 3C is a perspective view of device structure 310 shown in FIG. 2C.

Next, using reactive ion etching (RIE), silicon nanosheet layers 12 and SiGe alloy layers 14 are etched such that the sidewalls of the etched silicon nanosheet layers 12 and SiGe alloy layers 14 are tapered to form device structure 315, as shown in FIG. 2D. The tapering angle is selected so that a lower level nanosheet layer is wider than a higher level nanosheet layer in order to compensate for the lower level nanosheet layer's relatively higher source/drain resistance. Accordingly, the effective driver current of the nanosheet layer at each level is substantially the same. The higher the source/drain resistivity, the greater is the tapering angle. The alternating layers of silicon nanosheet 12 and SiGe layers 14 that remain following the RIE etch process are referred to herein as Si—SiGe pillars 25 and 30. In one example, the width of the pillars at the substrate interface is in the range of 5 nm to 40 nm. In one example, the spacing between the pillars at the substrate interface is in the range of 10 nm to 50 nm. FIG. 3D is a perspective view of device structure 315 shown in FIG. 2D.

Next, using anisotropic reactive ion etch (RIE) processing techniques, trenches are formed in the silicon substrate 10 and between SiGe pillars 25 and 30 to form device structure 320 shown in FIG. 2E. As is seen, trench is 45 formed between pillars 25, 30. As a result of this etching process, silicon pillar 35 is formed below Si—SiGe pillar 25, and silicon pillar 40 is formed below Si—SiGe pillar 30. It is understood that during the above trench formation process, trenches 41 and 42 are also formed. However, the silicon pillar disposed to the right of trench 42, as well as the silicon pillar disposed to the left of trench 41 are not shown to avoid clutter. In one example, the height of the silicon pillars is in the range of 50 nm to 300 nm. FIG. 3E is a perspective view of device structure 320 shown in FIG. 2E.

Next, trenches 41, 42 and 45 are filled with oxide via oxide deposition and etch back processes to form device structure 325 shown in FIG. 2F. The oxide-filled trenches 41, 45 and 42 are respectively identified as 58, 38 and 48 in FIG. 3F is a perspective view of the structure shown in FIG. 2F.

Figure 3I:
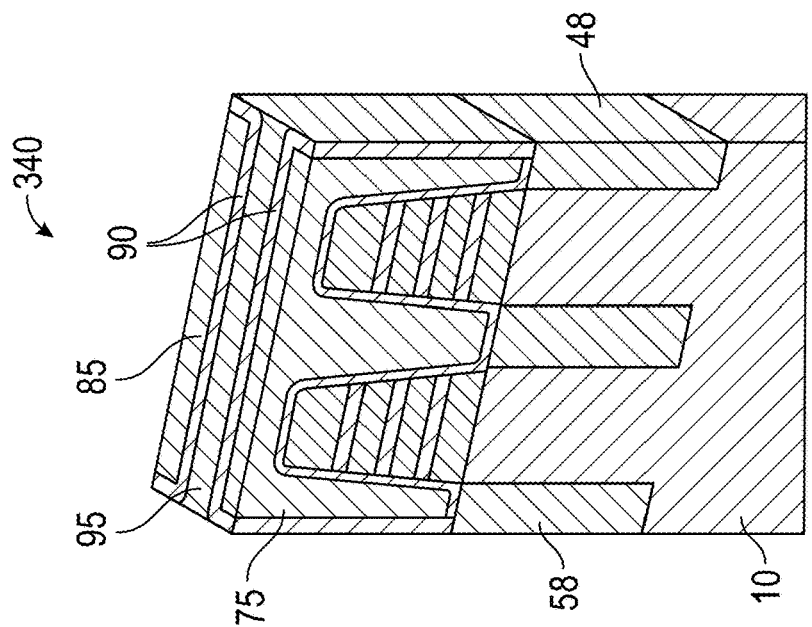
FIG. 3I is a perspective view of the device structure shown in FIG. 2I.
Figure 3H:
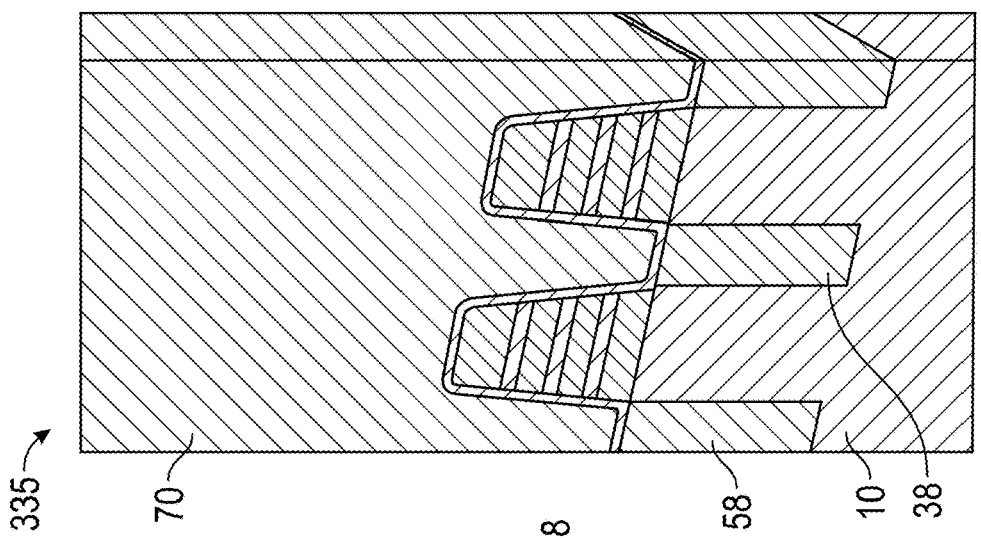
FIG. 3H is a perspective view of the device structure shown in FIG. 2H.
Figure 3G:
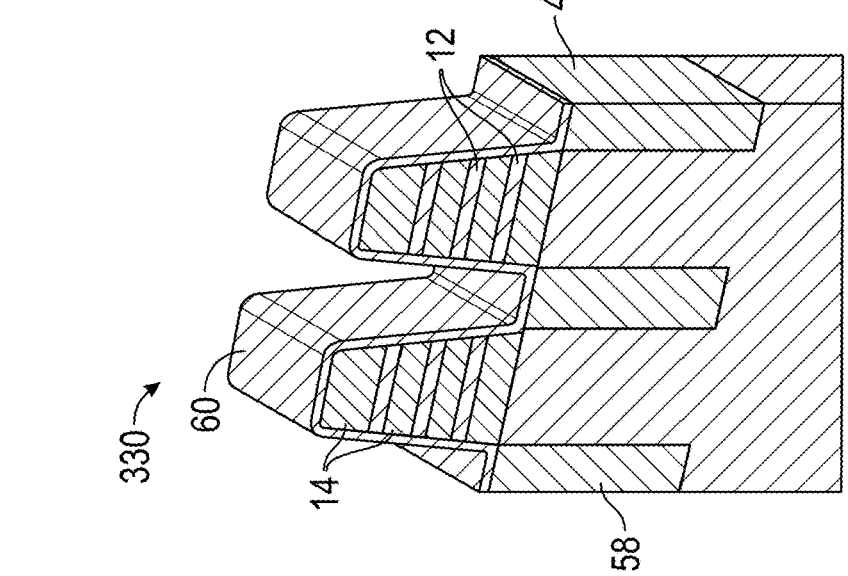
FIG. 3G is a perspective view of the device structure shown in FIG. 2G.

Next, mask layer 18 and oxide layer 16 are removed. Thereafter, the device structure undergoes a cleaning process, subsequent to which a relatively thin layer of protective oxide 60 (e.g., 3 nm to 8 nm) is deposited to cover the top and sidewalls of pillars 25, 30 as well as the top of oxide-filled trenches 38, 48, 58, thereby resulting in the formation of device structure 330 shown in FIG. 2G. FIG. 3G is a perspective view of the structure shown in FIG. 2G.

Figure 2H:
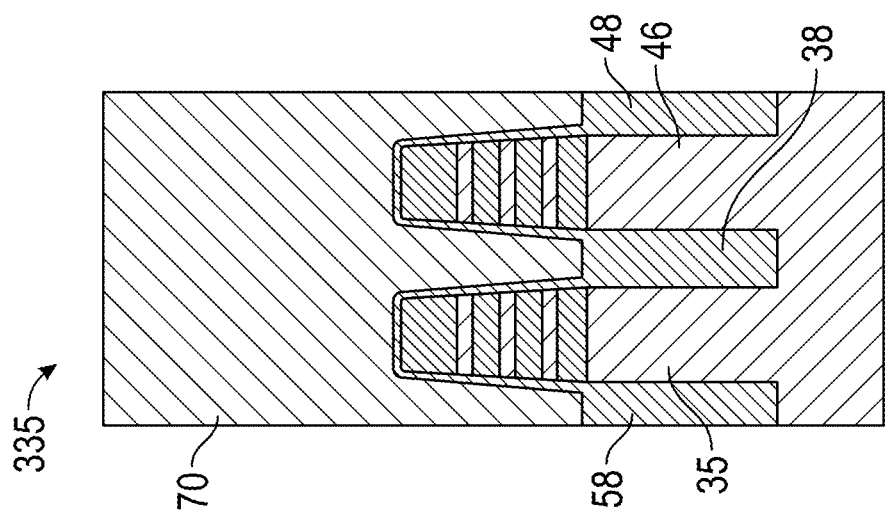
FIG. 2H shows the device structure of FIG. 2G after a polysilicon deposition step, in accordance with one embodiment of the present disclosure.

Next a layer of polysilicon 70 is formed over device structure 330 to form device structure 335, as shown in FIG. 2H. FIG. 3H is a perspective view of the device structure shown in FIG. 2H.

Figure 2I:
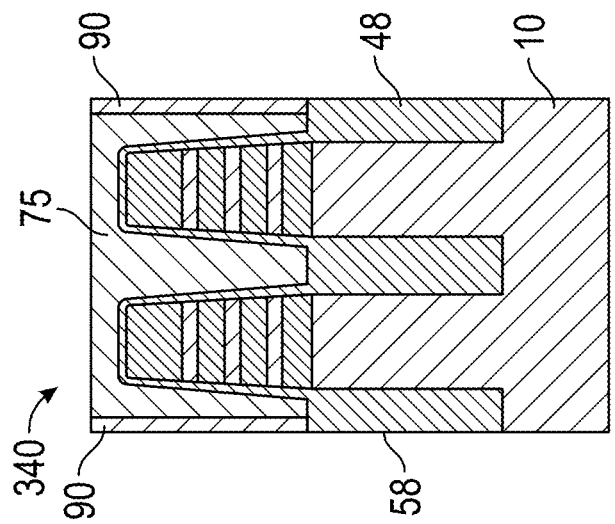
FIG. 2I shows the device structure of FIG. 2H after planarization of the polysilicon, and formation and filling of a trench, in accordance with one embodiment of the present disclosure.

Thereafter, referring to FIG. 2I, polysilicon 70 is planarized using a planarization technique, such as chemical mechanical polishing (CMP), so that the planarized polysilicon reaches a height of, for example, 40 nm to 100 nm, above the top of Si—SiGe pillars 25 and 35. Next, using lithography processes, a trench is formed in polysilicon 70 thereby separating polysilicon 70 into two distinct and isolated polysilicon blocks 75 and 85 as shown in FIG. 3I. The trench in the polysilicon is subsequently filled with silicon oxide 90 and silicon oxynitride 95 and planarized to form device structure 340 shown in FIG. 2I. FIGS. 3I and 4I respectively are the perspective and top views of device structure 340. As is seen from FIG. 3I, polysilicon blocks 75 and 85 are disposed along the two side of silicon oxide 90, that in turn, has a layer of silicon oxynitride 95 disposed therebetween. In one example, distance d between corresponding edges of polysilicon blocks 75 and 85 is in the range of 10 nm to 30 nm, as shown in FIG. 4.

Figure 2L:
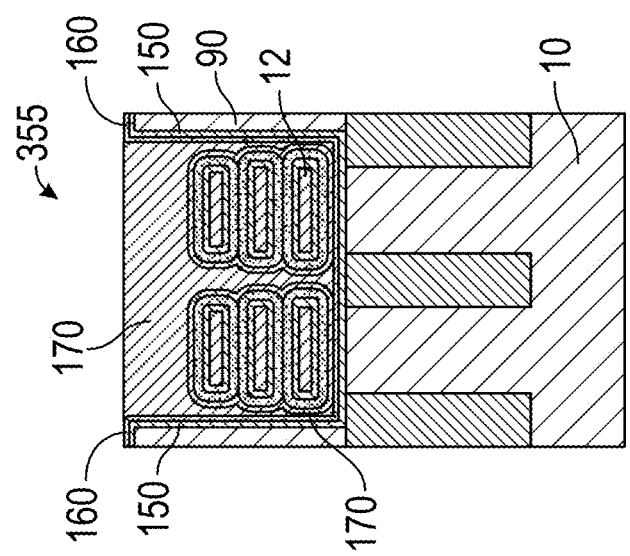
FIG. 2L shows the device structure of FIG. 2K after gate oxide, work function metal, and barrier metal deposition and patterning steps, in accordance with one embodiment of the present disclosure.
Figure 2K:
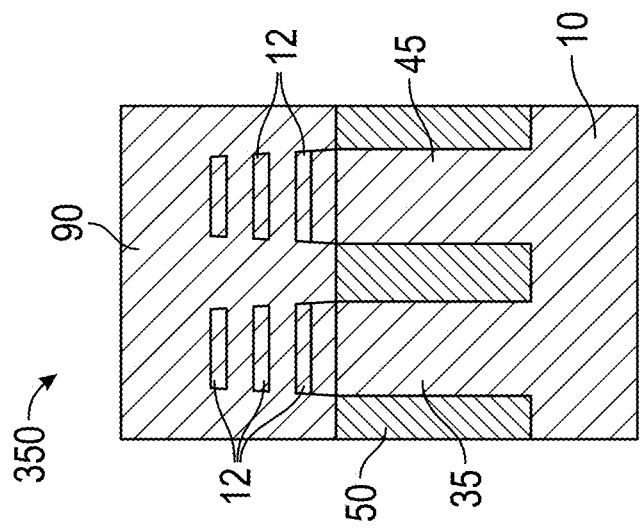
FIG. 2K shows the device structure of FIG. 2J after removal of the protective silicon oxide and SiGe layers, in accordance with one embodiment of the present disclosure.
Figure 2J:
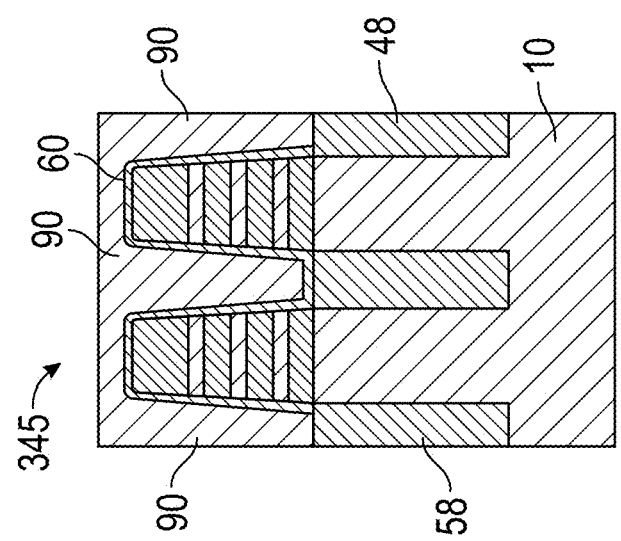
FIG. 2J shows the device structure of FIG. 2I after removal of the polysilicon, in accordance with one embodiment of the present disclosure.
Figure 3L:
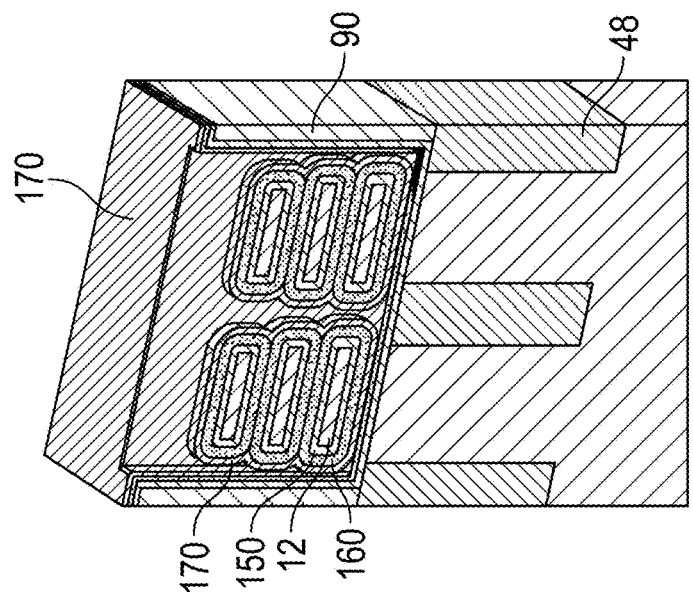
FIG. 3L is a perspective view of the device structure shown in FIG. 2L.
Figure 3K:
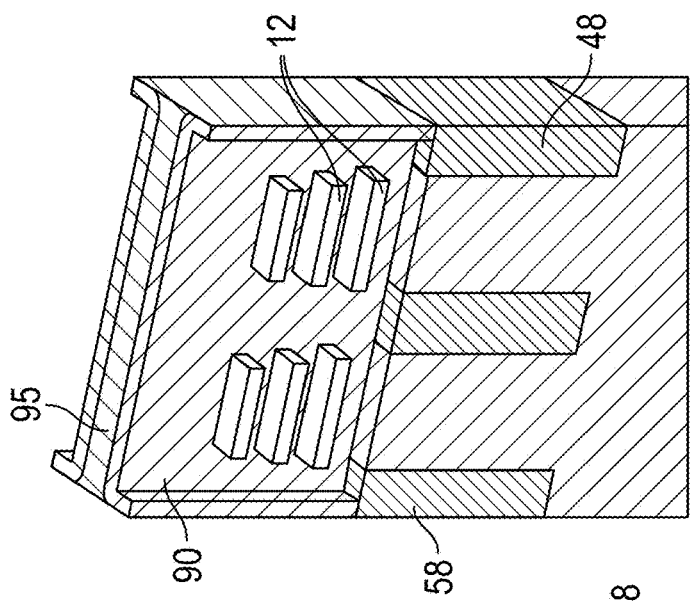
FIG. 3K is a perspective view of the device structure shown in FIG. 2K.
Figure 3J:
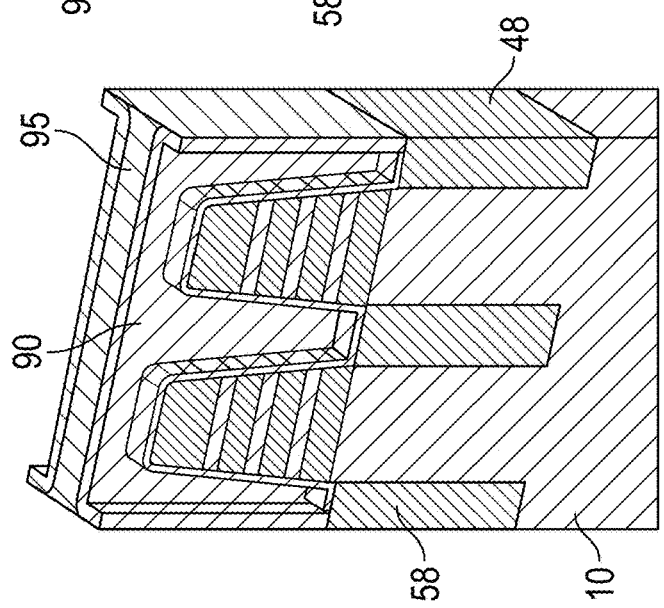
FIG. 3J is a perspective view of the device structure shown in FIG. 2J.

Next, the polysilicon blocks are removed from device structure 340 using a polysilicon etch process to form device structure 345 shown in FIG. 2J. Removal of the polysilicon blocks 75 and 85 exposes silicon oxide layer 90, protective silicon oxide layer 60, SiGe layers 14, and silicon nanosheets 12 which form the channels of GAAFETs. FIG. 3J is a perspective view of structure 345.

Next, the protective silicon oxide layer 60 and SiGe layers 14 are removed from device structure 345, using etching processes, to form device structure 350 shown in FIG. 2K. FIG. 3K is a perspective view of structure 350.

Thereafter, referring to FIG. 2L, a layer of gate oxide 150 is formed over structure 350 by thermal oxidation or deposition to enclose the silicon nanosheets 12, and cover the sidewalls and top edges of silicon oxide 90 and silicon oxynitride 95. Gate oxide layer 150 may include a layer of silicon oxide having a thickness of, for example, 0.5 nm, and grown using thermal oxidation, as well as a layer of hafnium oxide that is deposited and has a thickness ranging from 0.5 nm to 2 nm.

Next, a layer of work function metal 160 is deposited o enclose gate oxide layer 150 disposed around silicon nanosheets 12. In one example, work function metal 160 is Titanium Nitride (TiN) doped with Aluminum or Lanthanum. In another example, work function metal 160 function includes Tantalum Nitride, (TaN) or Titanium Aluminum (TiAl), or Titanium Aluminum Carbon (TiAlC) Work function metal layer 160 also covers gate oxide layer 150 formed along the sidewalls and top edges of silicon oxide 90 and silicon oxynitride 95. Work function metal layer 160 may have a thickness in the range of 1 nm to 1.5 nm. Thereafter, a layer of barrier metal 170 is deposited to enclose work function metal 160 and gate oxide layer 150 around silicon nanosheets 12. Barrier metal layer 170 also covers work function metal layer 160 disposed along the sidewalls and top edges of silicon oxide 90 and silicon oxynitride 95. Barrier metal layer 170 may have a thickness in the range of 2 nm to 3 nm and may be formed using the same material as work function metal 160. The resulting device structure 355 is shown in FIG. 2L. FIG. 3L is a perspective view of device structure 355.

Figure 2N:
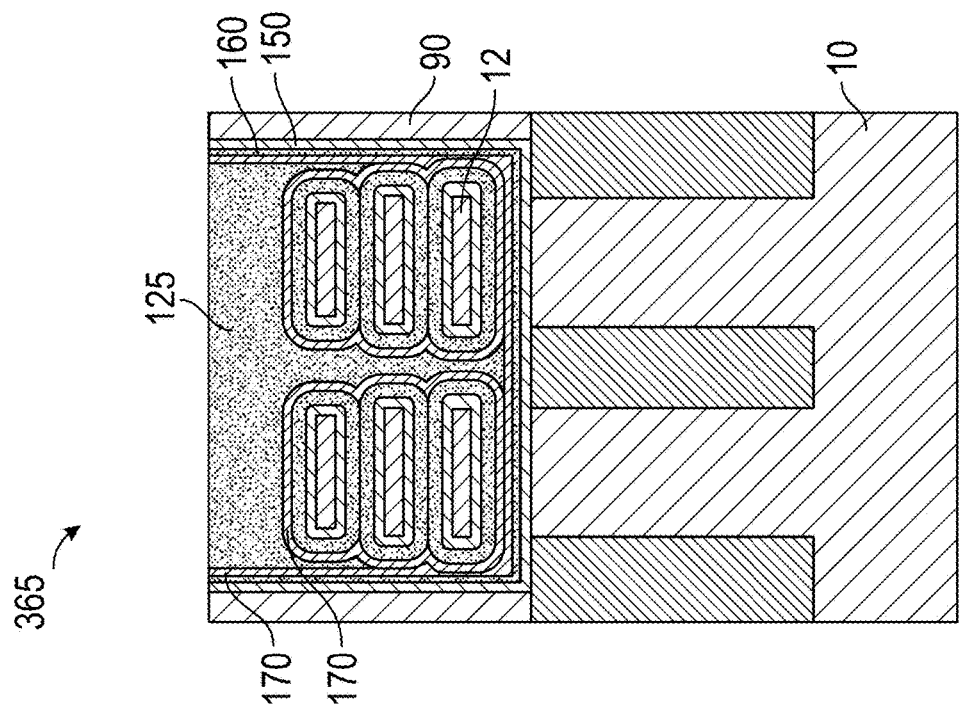
FIG. 2N shows the device structure of FIG. 2M after planarization of the Tungsten, in accordance with one embodiment of the present disclosure.
Figure 2M:
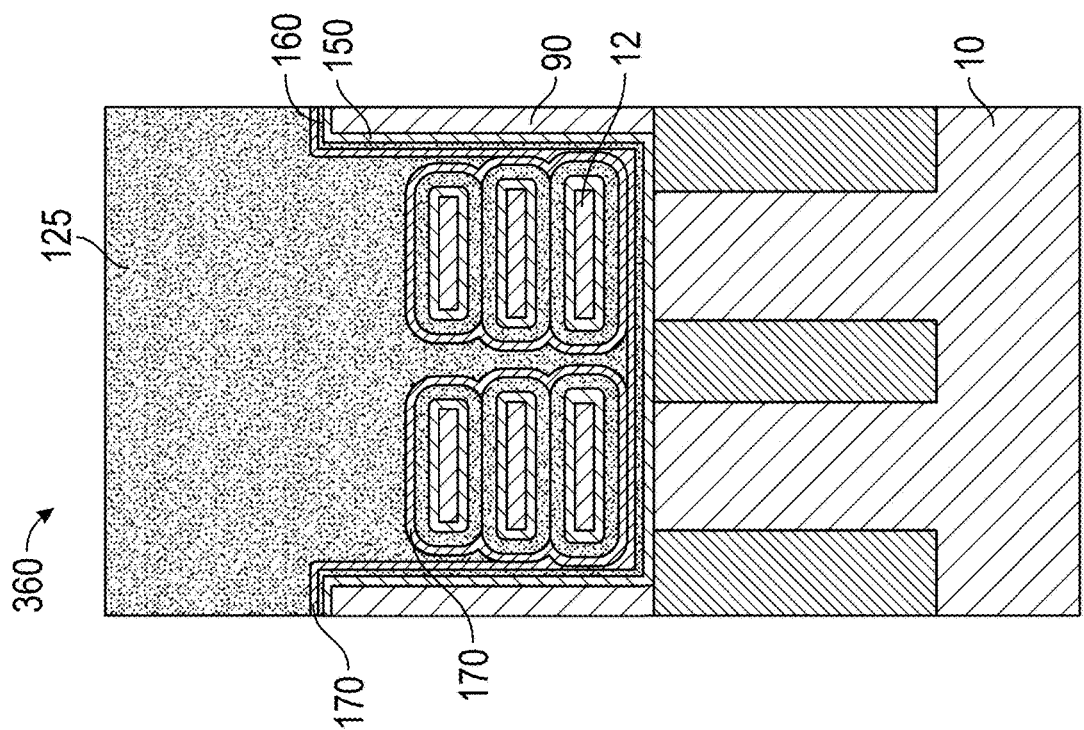
FIG. 2M shows the device structure of FIG. 2L after deposition of Tungsten, in accordance with one embodiment of the present disclosure.

Next, a layer of Tungsten 125 is deposited over structure 355 to form device structure 360 shown in FIG. 2M. FIG. 3M is a perspective view of structure 360. Thereafter, structure 360 is planarized to form device structure 365, as shown in FIG. 2N. FIG. 3N is a perspective view of structure 360 which is also shown and described above with reference to FIG. 1.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

The invention claimed is:

1. A method of forming a plurality of gate-all-around (GAA) Field Effect Transistors (FET) on a silicon substrate, the method comprising:
    forming a first layer of Silicon Germanium (SiGe) alloy above the silicon substrate;
    forming a first layer of silicon nanosheet above the first layer of SiGe alloy;
    forming a second layer of SiGe alloy above the first layer of silicon nanosheet;
    forming a second layer of silicon nanosheet above the second layer of SiGe alloy; and
    performing a reactive ion etch of the silicon nanosheet and SiGe alloy layers so as to form at least first and second tapered pillars of silicon nanosheet and SiGe alloy layers, wherein in each of the first and second tapered pillars a width of the etched first layer of silicon nanosheet is greater than a width of the etched second layer of silicon nanosheet, wherein the first silicon nanosheet layer disposed in the first tapered pillar forms a channel of a first GAAFET, the second silicon nanosheet layer disposed in the first tapered pillar forms a channel of a second GAAFET, the first silicon nanosheet layer disposed in the second tapered pillar forms a channel of a third GAAFET, and the second silicon nanosheet layer disposed in the second tapered pillar forms a channel of a fourth GAAFET.

2. The method of claim 1 further comprising:
    forming trenches in the silicon substrate; and
    filling the trenches with oxide.

3. The method of claim 2 further comprising:
    depositing a layer of protective oxide layer over the first and second tapered pillars and the oxide-filled trenches;
    depositing a layer of polysilicon over the protective oxide layer; and
    performing chemical mechanical polishing to planarize the polysilicon layer.

4. The method of claim 3 further comprising:
    forming a trench in the planarized polysilicon;
    forming a first layer of silicon oxide along a first sidewall of the planarized polysilicon in the trench;
    forming a second layer of silicon oxide along a second sidewall of the planarized polysilicon in the trench; and
    forming a layer of silicon oxynitride between the first and second silicon oxide layers in the trench.

5. The method of claim 4 further comprising:
removing the planarized polysilicon;
removing the protective oxide layer; and
removing the first and second layers of the SiGe alloy from the first and second tapered pillars.

6. The method of claim 5 further comprising:
forming a layer of gate oxide around each of the first and second silicon nanosheet layers of each of the first and second tapered pillars.

7. The method of claim 6 further comprising:
forming a layer of work function metal around the gate oxide layer of each of the first and second silicon nanosheet layers of each of the first and second tapered pillars; and
forming a layer of barrier metal around the work function metal layer of each of the first and second silicon nanosheet layers of each of the first and second tapered pillars.

8. The method of claim 7 further comprising:
depositing a layer of tungsten over the layer of barrier metal; and
planarizing the tungsten layer.

9. The method of claim 1 where each of the first and second tapered pillars form an angle ranging from 70° to 85° with respect to a surface of the silicon substrate.

10. The method of claim 1 further comprising:
forming a third layer of SiGe alloy above the second layer of silicon nanosheet;
depositing an oxide buffer layer above the third layer of SiGe alloy;
depositing a mask layer above the oxide buffer layer; and
patterning the mask and the oxide buffer layers to expose a surface of the third layer of SiGe alloy.

11. A semiconductor device structure comprising:
a first silicon pillar formed above a silicon substrate;
a second silicon pillar formed above the silicon substrate and insulated from the first silicon pillar by an oxide filled trench;
a first silicon nanosheet layer formed above the first silicon pillar and positioned at a first height relative to a surface of the substrate, wherein the first silicon nanosheet layer has a first width;
a second silicon nanosheet layer formed above the first silicon pillar and positioned at a second height relative to the surface of the substrate, wherein the second height is greater than the first height, wherein the second silicon nanosheet layer has a second width smaller than the first width;
a first silicon nanosheet layer formed above the second silicon pillar and positioned at the first height, wherein the first silicon nanosheet layer formed above the second silicon pillar has the first width; and
a second silicon nanosheet layer formed above the second silicon pillar and positioned at the second height, wherein the second silicon nanosheet layer formed above the second silicon pillar has the second width, wherein the first and second silicon nanosheet layers associated with the first silicon pillar form first and second channels of first and second gate-all-around (GAA) Field Effect Transistors (FET) respectively, and wherein the first and second silicon nanosheet layers associated with the second silicon pillar form third and fourth channels of third and fourth GAAFETs respectively.

12. The semiconductor device structure of claim 11 further comprising:
a layer of oxide formed above the first and second silicon pillars and the trench, wherein the first and second silicon nanosheet layers associated with each of the first and second silicon pillars protrude from the layer of oxide.

13. The semiconductor device structure of claim 11 wherein the first and second silicon pillars are formed by etching the silicon substrate.

14. The semiconductor device structure of claim 13 further comprising:
a layer of gate oxide disposed around the first and second silicon nanosheet layers associated with each of the first and second silicon pillars.

15. The semiconductor structure of claim 14 wherein the gate oxide layer disposed around the first and second silicon nanosheet layers associated with each of the first and second silicon pillars includes silicon oxide and hafnium oxide.

16. The semiconductor device structure of claim 14 further comprising:
a layer of work function metal disposed around the gate oxide layers of each of the first and second silicon nanosheet layers associated with each of the first and second silicon pillars.

17. The semiconductor device structure of claim 16 further comprising:
a layer of barrier metal disposed around the work function metal of each the first and second silicon nanosheet layers associated with each of the first and second silicon pillars.

18. A non-transitory computer readable medium comprising stored instructions, which when executed by a processor, cause the processor to:
form a first layer of Silicon Germanium (SiGe) alloy above a silicon substrate;
form a first layer of silicon nanosheet above the first layer of SiGe alloy;
form a second layer of SiGe alloy above the first layer of silicon nanosheet;
form a second layer of silicon nanosheet above the second layer of SiGe alloy; and
perform a reactive ion etch of the silicon nanosheet and SiGe alloy layers so as to form at least first and second tapered pillars of silicon nanosheet and SiGe alloy layers, wherein in each of the first and second tapered pillars a width of the etched first layer of silicon nanosheet is greater than a width of the etched second layer of silicon nanosheet, wherein the first silicon nanosheet layer disposed in the first tapered pillar forms a channel of a first GAAFET, the second silicon nanosheet layer disposed in the first tapered pillar forms a channel of a second GAAFET, the first silicon nanosheet layer disposed in the second tapered pillar forms a channel of a third GAAFET, and the second silicon nanosheet layer disposed in the second tapered pillar forms a channel of a fourth GAAFET.

* * * * *